United States Patent
Anderson et al.

(10) Patent No.: US 7,733,142 B2
(45) Date of Patent: Jun. 8, 2010

(54) EDGE RATE CONTROL FOR I²C BUS APPLICATIONS

(75) Inventors: Alma Anderson, Chandler, AZ (US); Joseph Rutkowski, Chandler, AZ (US); Dave Oehler, Gilbert, AZ (US)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 11/816,710

(22) PCT Filed: Feb. 24, 2006

(86) PCT No.: PCT/IB2006/050596

§ 371 (c)(1),
(2), (4) Date: Sep. 18, 2008

(87) PCT Pub. No.: WO2006/090344

PCT Pub. Date: Aug. 31, 2006

(65) Prior Publication Data

US 2009/0066381 A1    Mar. 12, 2009

Related U.S. Application Data

(60) Provisional application No. 60/656,736, filed on Feb. 25, 2005, provisional application No. 60/686,843, filed on Jun. 1, 2005.

(51) Int. Cl.
*H03K 5/12* (2006.01)

(52) U.S. Cl. .................. 327/170; 327/24

(58) Field of Classification Search ........... 327/170, 327/24
See application file for complete search history.

(56) References Cited

U.S. PATENT DOCUMENTS

| | | | |
|---|---|---|---|
| 4,689,740 A | 8/1987 | Moelands et al. | |
| 5,557,223 A | 9/1996 | Kuo | |
| 5,559,502 A | 9/1996 | Schutte | |
| 5,818,260 A | 10/1998 | Kuo | |
| 5,883,531 A | 3/1999 | Kuo | |
| 2003/0107909 A1* | 6/2003 | Nakamura | 365/63 |

FOREIGN PATENT DOCUMENTS

| EP | 0368524 B1 | 5/1990 |
|---|---|---|
| EP | 0596475 B1 | 5/1993 |

* cited by examiner

*Primary Examiner*—Lincoln Donovan
*Assistant Examiner*—Daniel Rojas

(57) ABSTRACT

Consistent with an example embodiment, an edge-rate control circuit arrangement (300) for an I²C bus application comprises a first circuit stage (10, M1, M3), responsive to a state transition of a received signal. A second circuit stage (310, 25, 20, 35, 45, M4, ESD) is responsive to the state transition of the received signal and includes drive circuitry (M4) that is activated in response to the state transition of the received signal in order to provide an edge-transition signal for an I²C bus, and regulation circuitry (310, R1, R2, M0, M2) adapted to control the drive circuit and regulate a transition rate for the edge-transition signal, the transition rate being greater than a transition rate of the received signal at the first circuit stage and greater than a minimum and less than a maximum transition rate designated for communication on the I²C bus.

20 Claims, 3 Drawing Sheets

EDGE RATE CONTROL FOR I²C BUS APPLICATIONS

This application claims priority from provisional application titled, "Edge-Rate Control," application Ser. No. 60/656,736 filed on Feb. 25, 2005.

The invention relates to edge rate control for Inter-IC communication (I²C) circuits. In particular, the invention relates to providing edge rate control for an I²C device which is intended for use over a wide range of supply voltages.

The Inter-IC bus, commonly known as the I²C ("eye-squared-see") bus, is a control bus that provides the communications link between integrated circuits in a system. Developed by Philips in the early 1980s, this simple two-wire bus with a software-defined protocol has evolved to become the de facto worldwide standard for system control, finding its way into everything from temperature sensors and voltage level translators to EEPROMs, general-purpose I/O, A/D and D/A converters, CODECs, and microprocessors of all kinds. U.S. Pat. No. 4,689,740 of Moelands et al. titled, "Two-Wire Bus-System Comprising a Clock Wire and a Data Wire for Interconnecting a Number of Stations" describes a computer system that comprises a number of station which are interconnected by means of a clock bus wire and a data bus wire which both form a wired logic function of the signals generated thereon by the stations, and is incorporated by reference in its entirety.

There are several reasons why the I²C-bus has endured for more than 20 years. To begin, the bus has kept pace with performance and today provides three levels of data rate transfer: up to 100 kbps in Standard mode, up to 400 kbps in Fast mode, and up to 3.4 Mbps in High-Speed mode. Recently introduced hubs, bus repeaters, bidirectional switches and multiplexers have increased the number of devices the bus can support, extending bus capacitance well beyond its original maximum of 400 pF. Also, software-controlled collision detection and arbitration prevent data corruption and ensure reliable performance, even in complex systems. Beyond performance, though, there is ease of use. Two simple lines connect all the ICs in a system. Any I²C device can be attached to a common I²C-bus, and any master device can exchange information with any slave device. The software-controlled addressing scheme eliminates the need for address-decoding hardware, and there's no need to design and debug external control logic because it's already provided by the I²C protocol.

Designers can move quickly from block diagram to final hardware, simply clipping new devices and functions to an existing bus. The I²C-bus also saves space and lowers overall cost. The two-line structure means fewer trace lines, so the PCB can be much smaller. Debug and test are easier, too, since there are fewer trace lines and fewer information sources to verify. As the system evolves over several generations, I²C devices can easily be added or removed without impacting the rest of the system.

In signaling within the I2C bus and other buses, it is important to minimize the propagation of noise from a device's inputs to the device's outputs. For example, the simultaneous switching of inputs may generate noise as the inputs transition from one logic state to another, as in the case of transitioning from a logic "0" and a logic "1." Edge rate control is often used to minimize the likelihood of output noise. Delay is introduced such that the output does not transition to a different logic state until sufficient time has elapsed from the transient noise (e.g., ringing, switching noise, etc.) induced at the inputs.

In some I²C applications, edge rate control for I2C outputs uses a capacitor feedback to slow the falling edge. One method to create a constant edge rate *requires a fixed current source used in conjunction with the feedback capacitor to set the falling edge to a fixed dv/dt. Another method for controlling edge rates, which dissipates no static current, uses a resistor to limit the charging current. This method results in an RC type edge control.

In an example application, the edge rate control method uses a current mirror, which consumes static current. This method also produces variations in the fall-time as a function of the bus voltage, because of the fixed dv/dt rate (i.e. it takes longer to make the transition from $0.7*V_{dd}$ to $0.3*V_{dd}$ when the Vdd is larger).

Making reference to FIG. 1 that depicts the IC edge rate control method. Shown is an example waveform plot of input voltage, $V_{in}$ and output voltage, $V_{out}$ versus rise/fall time. Two input signals at two example input voltages (125, 130) of about 2.25V and about 5.5V, both transition from a logic "1" to logic "0" at about 3.52 µS for $T_1$. After predetermined delays, the output responses transition from high to low. The delay for waveform 125' is significantly less than that of waveform 130'. Waveform 125' transitions from high to low at about 3.6 µS for a $T_{delay125}=(T_2-T_1)$ that is, a $T_{delay125}=(3.60\text{ µS} - 3.52\text{ µS})=0.08$ µS. Waveform 130 transitions from low at about 3.75 µS for a $T_{delay130}=(T3-T1)$ that is, a $T_{delay130}=(3.52\text{ µS} - 3.75\text{ µS})=0.23$ µS. The difference between the delay of 125' and 130' is about 0.15 µS.

On the other hand in another example application (i.e., RC edge rate control), a resistor-limited current has no static current, once the transition is complete. However, the transition from $0.7*V_{dd}$ to $0.3*V_{dd}$ speeds up as the $V_{dd}$ increases because the available charging current is a function of $V_{dd}$ and the delay before the output starts to fall increases rapidly as the $V_{dd}$ is reduced. In situations in which one I²C part is used for multiple applications, these variations in rise and fall times would limit the versatility of the part.

Making reference to FIG. 2 the RC edge rate control method is depicted. Shown is an example waveform plot of input voltage, $V_{in}$ and output voltage, $V_{out}$ versus rise/fall time. Two input signals at two example input voltages (225, 230) of about 2.25V and about 5.5V, both transition from a logic "1" to logic "0" at about 3.52 µS (indicated as $T_4$). After predetermined delays, the output responses transition from high to low. The delay for waveform 225' is significantly more than that of waveform 230'. Waveform 225' transitions from high to low at about 3.64 µS for a $T_{delay225}'=(T_4-T_5)$ that is, a $T_{delay225'}=(3.64\text{ µS} - 3.52\text{ µS})=0.12$ µS. Waveform 230 transitions from high to low at about 3.75 µS for a $T_{delay230'}=(T6-T4)$ that is, a $T_{delay230'}=(3.57\text{ µS} - 3.52\text{ µS})=0.05$ µS. The difference between the delay of 225' and 230' is about 0.07 µS.

There exists a need for a circuit useful for I²C parts where the same part may be used over a wide range of supply voltages and have minimum propagation delay while preserving the noise reduction benefits of edge rate control and also have zero static power in power sensitive applications such as portable hand-held equipment.

The present invention has been found useful in I²C applications that require components that maintain their performance over a wide latitude of operating conditions such as supply voltages. This invention combines the zero static power of the resistor capacitor edge rate control method with the faster turn on feature of the current mirror controlled output falling edge control. It also produces a more constant transition time over a wide $V_{dd}$ range.

In an example embodiment, there is an edge-rate control circuit arrangement for an I²C bus application comprises a first circuit stage, responsive to a state transition of a received signal. A second circuit stage is responsive to the state transition of the received signal. The second circuit stage includes drive circuitry that is activated in response to the state transition of the received signal in order to provide an edge-transition signal for an I²C bus; regulation circuitry is adapted to control the drive circuit and regulate a transition rate for the edge-transition signal. The transition rate is greater than a transition rate of the received signal at the first circuit stage and less than the maximum and greater than the minimum transition rate designated for communication on the I²C bus.

In another example embodiment, there is an edge-rate control circuit arrangement for a serial-communication bus application. The arrangement comprises a first means for responding to a state transition of a received signal. There is a second means for responding to the state transition of the received signal. The second means includes means for activating in response to the state transition of the received signal in order to provide an edge-transition signal for an I²C bus and means for controlling the drive circuit and regulating a transition rate for the edge-transition signal. The transition rate is greater than a transition rate of the received signal and less than the maximum and greater than the minimum transition rate designated for communication on the serial-communication bus.

In yet another example embodiment, there is an edge rate control circuit for use in an I²C bus. The circuit comprises a resistor divider having a first terminal, a divider terminal, and a second terminal. There is a first NMOS transistor having a source, drain, and gate terminal and a first PMOS transistor having a source, drain, and gate terminal; the drain terminals of the first NMOS and first PMOS transistors are coupled to one another; the source terminal of the first PMOS transistor is coupled to the divider terminal of the resistor divider; the gate of the first PMOS transistor is coupled to the second terminal of the resistor divider; and the source of the first NMOS transistor is coupled to ground. The embodiment further comprises, a second NMOS transistor having a source, drain, and gate terminal and a second PMOS transistor having a source, drain, and gate terminal, the gate of the second PMOS transistor coupled to the gate of the second NMOS transistor, at an input terminal, the drain of the second PMOS transistor coupled to the first terminal of the resistor divider, the drain of the second NMOS transistor coupled to the second terminal of the resistor divider. There is a third NMOS transistor having a source, drain, and gate terminal. A capacitor having a first terminal and a second terminal, the first terminal of the capacitor is coupled to the gate of the third NMOS transistor and the second terminal of the resistor divider. The second terminal of the capacitor is coupled to the drain of the third NMOS transistor at an output terminal, and the source of the third NMOS transistor is coupled to ground. An ESD protection circuit is interposed between the output terminal and the gate of the first NMOS transistor.

The above summaries of the present invention are not intended to represent each disclosed embodiment, or every aspect, of the present invention. Other aspects and example embodiments are provided in the figures and the detailed description that follows.

The invention may be more completely understood in consideration of the following detailed description of various embodiments of the invention in connection with the accompanying drawing, in which.

Figure 1:
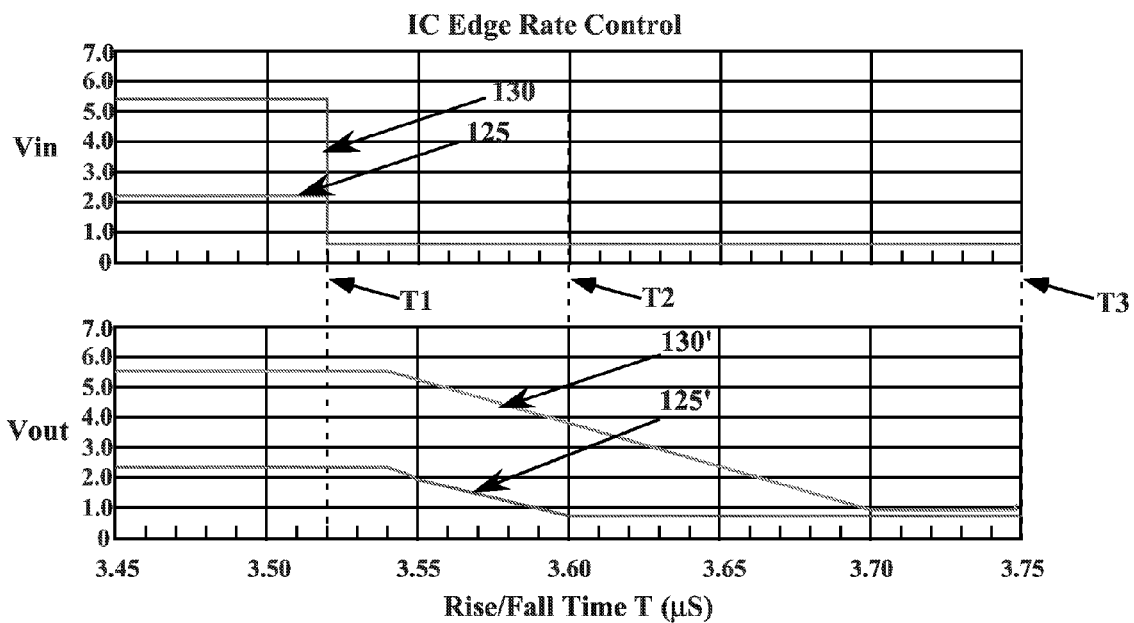
FIG. 1 (Prior Art) depicts sample waveforms of an IC edge rate control.
Figure 2:
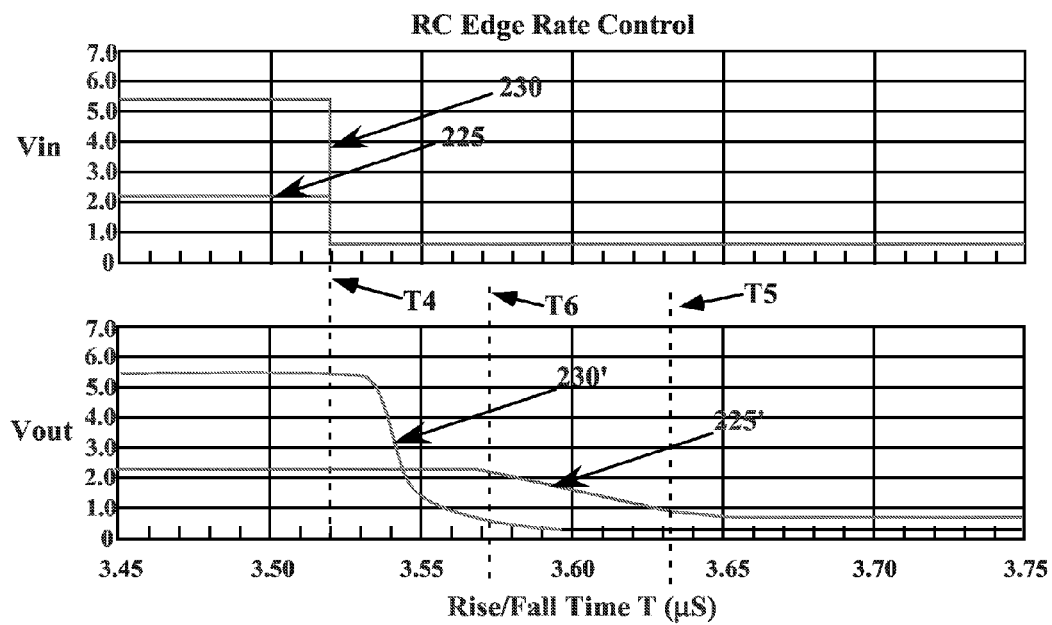
FIG. 2 (Prior Art) depicts sample waveforms of an RC edge rate control.

The present invention has been found useful in I²C applications that require components that maintain their performance over wide latitudes of operating conditions, such as supply voltage and temperature. This invention combines the zero static power of the resistor capacitor (RC) edge rate control method with the faster turn on feature of the current mirror controlled (IC) output falling edge control. It also produces a more constant transition time over the wide $V_{dd}$ range.

In an example embodiment according to the present invention, an edge rate control circuit includes a first circuit stage. The first circuit stage is responsive to a state transition of a signal received at an input terminal. A second circuit stage is responsive to the state transition of the received signal. Included within the second circuit stage, is drive circuitry. The drive circuitry is activated in response to the state transition of the received signal in order to provide an edge-transition signal for an I²C bus. Regulation circuitry is adapted to control the drive circuit and regulate a transition rate for the edge transition signal. It is desirable for the transition rate to be greater than a transition rate of the received signal at the input terminal at the first circuit stage. However, the transition rate should be greater than the minimum and less than the maximum transition rate designated for communication on the I²C bus.

Within the edge control circuit, the regulation circuitry is responsive to a feedback signal that is coupled to an output of the drive circuitry. For a particular bus application, such as I²C, the drive circuitry may be connected to the I²C bus. For other applications, the drive circuitry and regulation may share at least one circuit node. The regulation circuitry can further provide for the transition rate for the edge-transition signal as a function of circuit parameters of the second circuit stage and independent of loading parameters due to the I²C bus and independent of parameters of circuit elements external to the second circuit stage. In addition, the regulation circuitry can provide for the transition rate for the edge-transition signal as a function of circuit parameters of the second circuit stage and independent of voltage and current variations in a power supply level provided from a power node feeding power to the second circuit stage.

The edge-rate control circuit as described may include further features. The second circuit stage may include a current-shunt circuit that provides a consistent response to the state transition of the received signal by shunting excess current away from the drive circuitry. The current-shunt circuit may further include a voltage-divider circuit and a current switch circuit that activates in response to a voltage change present at a node in the voltage-divider circuit.

The regulation circuitry is responsive to a feedback signal that is in turn coupled to an output of the drive circuitry and wherein the feedback signal is coupled to the current-shunt circuit to facilitate regulation of the transition rate for the edge transition signal. In a particular example embodiment, the second stage includes an RC-based circuit that provides a fast response to the state transition of the received signal in order to activate the drive circuitry.

It should be noted that in the I²C bus there are at least two wires. I²C provides passive communication by permitting signaling via active pull-down or passive pull-up. The circuit arrangement according to the present invention is suitable for I²C bus and one or more additional circuits corresponding to the first circuit stage and the second circuit stage.

In describing an arrangement of components, the reader should note that in MOS devices, for P-MOS devices, the source is connected at the higher potential (e.g., $V_{dd}$) and the drain is connected at the lower potential. For N-MOS devices, the source is connected to the lower potential (e.g., $V_{ss}$) and the drain is connected to the higher potential. Electrically, the source and drain terminals are alike. It is often convenient in MOS transistor to refer to the source and drain terminals as source/drain or S/D terminals.

Figure 3:
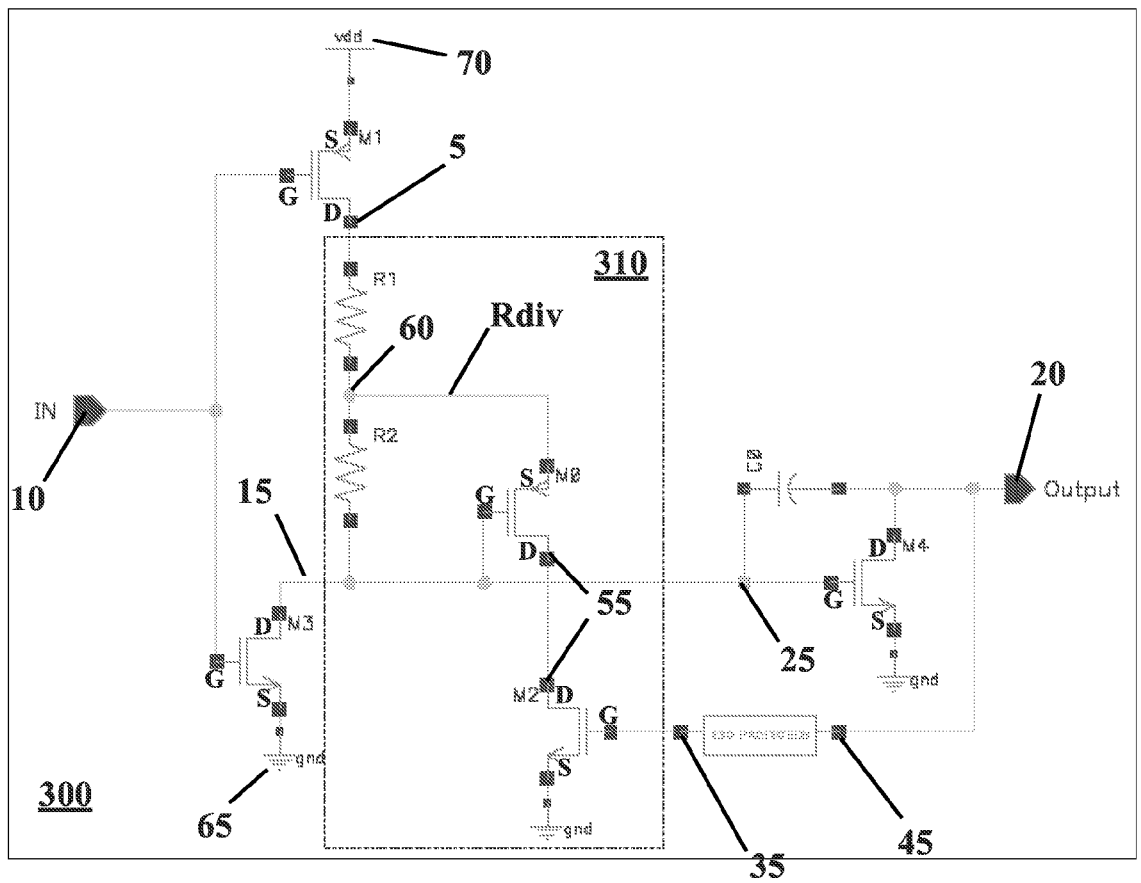
FIG. 3 depicts schematically a circuit for edge rate control according to an embodiment of the present invention.

Refer to FIG. 3. In an example embodiment according to the present invention, the edge rate control circuit the resistor of a resistor-capacitor edge rate control circuit is replaced with a current source that is switched on only during the falling edge of the output. It includes two resistors and two active transistors.

Circuit 300 includes and input 10 and an output 20 and sub-circuit 310. The gate terminal of P-type transistor M1 is coupled to the gate terminal of N-type transistor M3. In turn these gate terminals are coupled to the input 10. The source of M1 is coupled to $V_{dd}$ (70). The source of M3 is coupled to ground (65). Sub-circuit 310 is coupled the drain terminal of M1 (5) and drain terminal of M3 (15). Additional terminals 25 and 35 coupled to capacitor C0 and ESD protection, respectively. Sub-circuit 310 includes resistors R1 and R2 configured as a divider. Coupled to the divider are transistors M0 and M2. At node 5, drain terminal of M1 is coupled to R1. At connection 15, drain terminal of M3 is coupled to R2. Resistors R1 and R2 are coupled at Rdiv (60). Transistor M0 is P-type. The source of M0 is coupled to Rdiv. The drains of M0 and M2 are coupled to one another at node 55. The source of M2 is coupled to ground (65). Furthermore, at connection 15, as well as being couple to R2, connection 15 is coupled to the gate of transistor M0. At node 25, a first terminal of capacitor C0 is coupled to the gate terminal of transistor M0 and to the gate terminal of N-type transistor M4. The drain of transistor M4 is coupled to a second terminal of capacitor C0 coupled to output 20. The source of transistor M4 is coupled to ground (65). At node 35, a first terminal of an electrostatic protection circuit (ESD) block is coupled to the gate terminal of transistor M2. A second terminal 45 of the ESD protection is coupled to output 20. The ESD protection may be any circuit suitable for a given process technology used to fabricate the present invention.

During operation, resistors R1 and R2 along with transistors M0 and M2 replace the single resistor of an output edge rate control circuit. Resistor R2 is placed between the source and gate nodes of transistor M0 such that when the current flow in R2 causes a voltage drop equal to the threshold of M0, M0 switches on making a current path through R1, M0, and M2 to ground. As long as the output is high, transistor M2 will be conducting. When the voltage drop across the resistor divider R1 and R2 is sufficiently large that the voltage drop on R2 is equal to the threshold of M0, M0 starts to shunt current around R2 through M2 and to ground. This increases the voltage drop in R1. Thus, the current in R2 remains nearly constant as the voltage across R1 and R2 is increased above the minimum necessary to reach the threshold of M0 on R2. So the current into the gate of the output transistor used to pull the output down will be nearly constant independent of $V_{dd}$. M2 is sized such that it will stay on until the output falls to about a threshold voltage, at which point M2 turns off and the current drops to zero as the output transistor gate is fully charged to the supply voltage.

Figure 4:
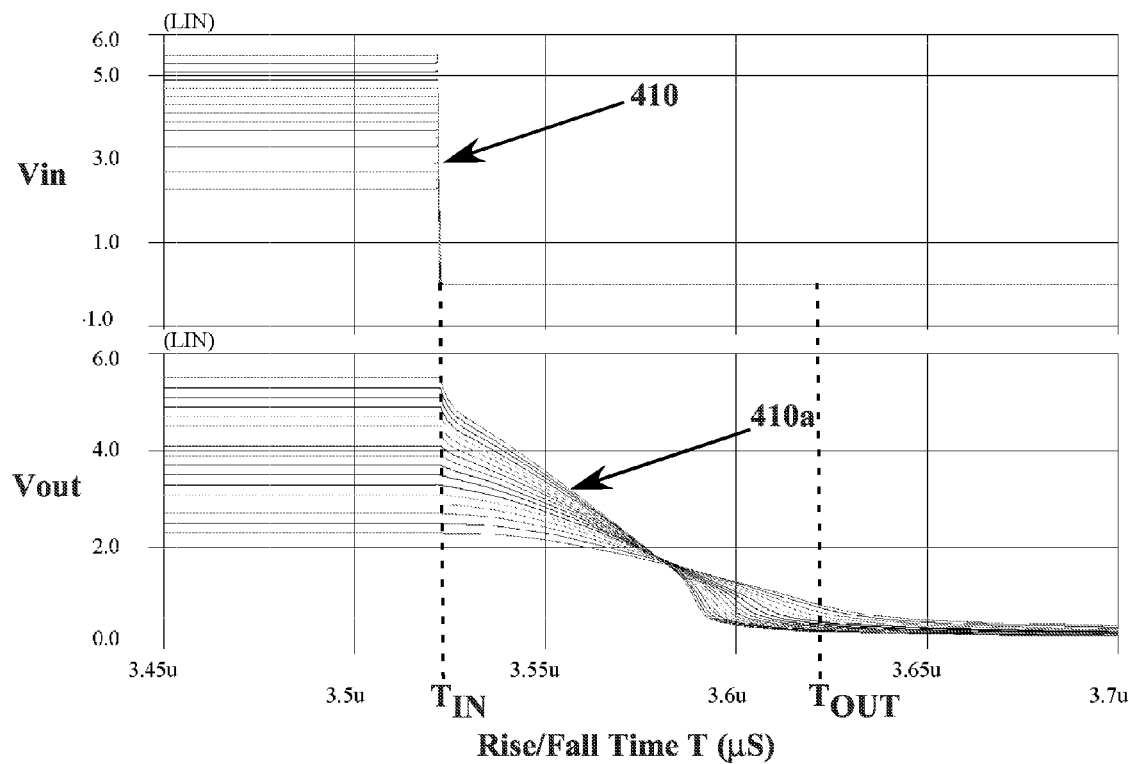
FIG. 4 depicts sample waveforms of an example circuit according to an embodiment of the present invention.

Reference is made to FIG. 4. The input/output characteristics of an example embodiment according to the present invention, may be observed. At a fixed load capacitance of about 10 pF, and at varying $V_{dd}$ from 2.3V to 5.5V, curves of $V_{in}$ and $V_{out}$ versus Time (μS) are plotted. Curve 410 shows $V_{in}$ at a number of $V_{dd}$ and curve 410a shows $V_{out}$ of the corresponding $V_{in}$. The $T_{delay}$ ($T_{out}-T_{in}$)=(3.62 μS–3.52 μS). $T_{delay}$ between the input and output does not vary significantly among the curves plotted for a range of $V_{dd}$. Thus, the present invention provides edge control less dependent on power supply voltage.

Figure 5:
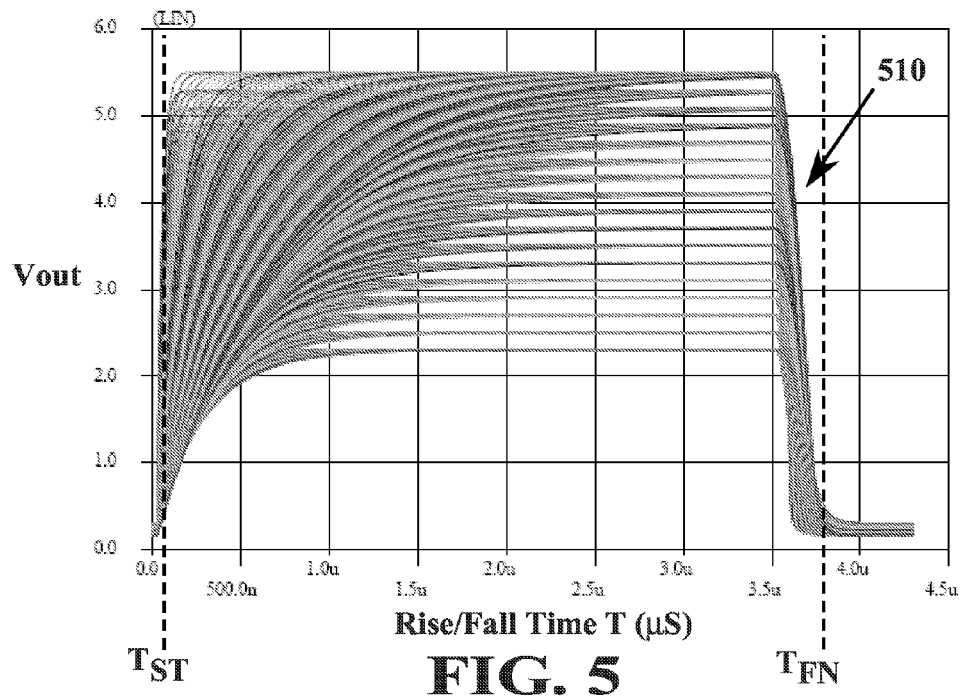
FIG. 5 depicts sample waveforms of an output signal at varying power supply voltages and varying capacitance loading according to an embodiment of the present invention.

Reference is made to FIG. 5. In an example embodiment according to the present invention, at a varying load capacitance from 100 pF to 4000 pF, and a Vdd range of about 2.3 to 3.5 V, the curves 510 exhibit similar delay characteristics in switching from low to high (TST) and back to low (TFN) in about 3.7 μS.

To achieve the edge-rate control as it relates to serial bus applications, in particular, the I²C bus, one is not necessarily limited to the circuit arrangement outlined in FIG. 3. In yet another example embodiment according to the present invention, an edge-rate control circuit arrangement for serial-communication on a bus may be configured with a first means for responding to a state transition of a received signal. A second means responds to the state transition of the received signal. The second means includes, means for activating, in response to the state transition in order to provide an edge-transition signal for an I²C bus and means for controlling the drive circuit and regulating a transition rate for the edge-transition signal. The transition rate is greater than a transition rate of the received signal and greater than the minimum and less than the maximum transition rate designated for communication on the serial communication bus. The serial communication bus may include a bus such as the I²C bus.

While the present invention has been described with reference to several particular example embodiments, those skilled in the art will recognize that many changes may be made thereto without departing from the spirit and scope of the present invention, which is set forth in the following claims.

What is claimed is:

1. An edge-rate control circuit arrangement for an I²C bus application, the arrangement comprising:
   a first circuit stage, responsive to a state transition of a received signal; and
   a second circuit stage responsive to the state transition of the received signal, the second circuit stage comprising:
      drive circuitry that is activated in response to the state transition of the received signal in order to provide an edge-transition signal for an I²C bus,
      regulation circuitry that controls the drive circuitry and regulates a transition rate for the edge-transition signal, the transition rate being greater than a transition rate of the received signal at the first circuit stage and greater than a minimum and less than a maximum transition rate designated for communication on the I²C bus, wherein the regulation circuitry comprises:
         a current-shunt circuit that provides a consistent response to the state transition of the received signal by shunting excess current away from the drive circuitry, the current-shunt circuit including a voltage-divider circuit and a current switch circuit that is activated in response to a voltage change present at a node in the voltage-divider circuit.

2. The edge-rate control circuit arrangement of claim 1, wherein the regulation circuitry is responsive to a feedback signal which is in turn coupled to an output of the drive circuitry.

3. The edge-rate control circuit arrangement of claim 1, wherein the drive circuitry is connected to the I$^2$C bus.

4. The edge-rate control circuit arrangement of claim 1, wherein the drive circuit and the regulation circuitry share at least one circuit node.

5. The edge-rate control circuit arrangement of claim 1, wherein the regulation circuitry provides the transition rate for the edge-transition signal as a function of circuit parameters of the second circuit stage and independent of loading parameters due to the I$^2$C bus.

6. The edge-rate control circuit arrangement of claim 1, wherein the regulation circuitry provides the transition rate for the edge-transition signal as a function of circuit parameters of the second circuit stage and independent of parameters of circuit elements external to the second circuit stage.

7. The edge-rate control circuit arrangement of claim 1, wherein the regulation circuitry provides the transition rate for the edge-transition signal as a function of circuit parameters of the second circuit stage and independent of voltage and current variations in a power supply level provided from a power node feeding power to the second circuit stage.

8. The edge-rate control circuit arrangement of claim 1, wherein the regulation circuitry is responsive to a feedback signal which is in turn coupled to an output of the drive circuitry, and the feedback signal is coupled to the current-shunt circuit to facilitate regulation of the transition rate for the edge-transition signal.

9. The edge-rate control circuit arrangement of claim 1, wherein the second circuit stage comprises:
 an RC-based circuit that provides a fast response to the state transition of the received signal in order to activate the drive circuitry.

10. The edge-rate control circuit arrangement of claim 1, wherein the I$^2$C bus has at least two wires and provides passive communication by permitting signaling via active pull down and passive pull up.

11. The edge-rate control circuit arrangement of claim 1, wherein the I$^2$C bus has at least two wires and provides passive communication by permitting signaling via passive pull up.

12. The edge-rate control circuit arrangement of claim 1, further including the I$^2$C bus and at least one additional circuit including circuits corresponding to the said first and second circuit stages.

13. An edge-rate control circuit arrangement for a serial-communication bus application, the arrangement comprising:
 first means for responding to a state transition of a received signal; and
 second means for responding to the state transition of the received signal, the second means comprising:
  means for activating in response to the state transition of the received signal in order to provide an edge-transition signal for the serial-communication bus, and
  means for controlling the means for activating, said controlling including regulation of a transition rate for the edge-transition signal, the transition rate being greater than a transition rate of the received signal at the first circuit stage and greater than a minimum and less than a maximum transition rate designated for communication on the serial-communication bus, wherein the means for controlling comprises:
  means for providing a consistent response to the state transition of the received signal by shunting excess current away from the drive circuitry, the means for providing including a voltage-divider circuit and a current switch circuit that is activated in response to a voltage change present at a node in the voltage-divider circuit.

14. The edge-rate control circuit arrangement of claim 13, wherein the serial-communication bus is an I$^2$C bus.

15. A method of edge-rate control for an I$^2$C bus, the method comprising:
 responding, with a first circuit stage, to a state transition of a received signal; and
 responding, with a second circuit stage, to the state transition of the received signal;
 activating a drive circuitry in response to the state transition of the received signal to provide an edge-transition signal for the I$^2$C bus;
 regulating the drive circuitry, with a regulation circuitry, to regulate a transition rate for the edge-transition signal, the transition rate being greater than a transition rate of the received signal at the first circuit stage and greater than a minimum and less than a maximum transition rate designated for communication on the I$^2$C bus;
 providing, by an operation of a current-shunt circuit, a consistent response to the state transition of the received signal by shunting excess current away from the drive circuitry; and
 activating, inside the current-shunt circuit, a current switch circuit in response to a voltage change present at a node in a voltage-divider circuit.

16. The method of claim 15, further comprising:
 responding, with the regulation circuitry, to a feedback signal that is coupled to an output of the drive circuitry.

17. The method of claim 15, further comprising:
 providing, with the regulation circuitry, the transition rate for the edge-transition signal as a function of circuit parameters of the second circuit stage and independent of loading parameters due to the I$^2$C bus.

18. The method of claim 15, further comprising:
 providing, with the regulation circuitry, the transition rate for the edge-transition signal as a function of circuit parameters of the second circuit stage and independent of parameters of circuit elements external to the second circuit stage.

19. The method of claim 15, further comprising:
 providing, with the regulation circuitry, the transition rate for the edge-transition signal as a function of circuit parameters of the second circuit stage and independent of voltage and current variations in a power supply level provided from a power node feeding power to the second circuit stage.

20. The method of claim 15, further comprising:
 responding, with the regulation circuitry, to a feedback signal that is coupled to an output of the drive circuitry and to the current-shunt circuit to facilitate regulation of the transition rate for the edge-transition signal.

* * * * *